(12) United States Patent
Thei et al.

(10) Patent No.: US 7,064,056 B2
(45) Date of Patent: Jun. 20, 2006

(54) BARRIER LAYER STACK TO PREVENT TI DIFFUSION

(75) Inventors: Kong-Beng Thei, Hsin-Chu (TW);
Chun-Lung Cheng, Tu-Chen (TW);
His-Chien Lin, Hsin-Chu (TW);
Li-Don Chen, Hsin-Chu (TW);
Tung-Lung Lai, Hsin-Chu (TW);
Chi-Lung Lin, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 162 days.

(21) Appl. No.: 10/460,981

(22) Filed: Jun. 13, 2003

(65) Prior Publication Data
US 2004/0253807 A1  Dec. 16, 2004

(51) Int. Cl.
*H01L 21/4763*   (2006.01)
(52) U.S. Cl. .................................... 438/627
(58) Field of Classification Search ............... 438/627
See application file for complete search history.

(56) References Cited
U.S. PATENT DOCUMENTS 5,972,179 A * 10/1999 Chittipeddi et al. ... 204/192.17
6,326,287 B1 * 12/2001 Asahina et al. ............. 438/584
6,410,986 B1 * 6/2002 Merchant et al. ........... 257/763
6,498,091 B1 * 12/2002 Chen et al. .................. 438/627
6,617,231 B1 * 9/2003 Griffin et al. ............... 438/597
6,706,626 B1 * 3/2004 Huang ........................ 438/653
6,900,119 B1 * 5/2005 Hu .............................. 438/627

\* cited by examiner

*Primary Examiner*—W. David Coleman
(74) *Attorney, Agent, or Firm*—Thomas, Kayden, Horstemeyer & Risley

(57) ABSTRACT

An improved barrier layer stack and method for forming the same for preserving an aluminum alloy interconnect resistivity, the method comprising providing a semiconductor process wafer comprising an exposed conductive region; forming a first barrier layer comprising a barrier layer stack over the exposed conductive region comprising one of a TiN or Ti layer in contact with the conductive region; forming at least one additional barrier layer comprising the barrier layer stack to form an alternating sequence of TiN and Ti layers; forming an uppermost barrier layer of TiN comprising the barrier layer stack; forming an overlying aluminum alloy region in contact with the uppermost barrier layer; and, subjecting the semiconductor process wafer to at least one process comprising a temperature of greater than temperatures greater than about 350° C.

17 Claims, 2 Drawing Sheets

BARRIER LAYER STACK TO PREVENT TI DIFFUSION

FIELD OF THE INVENTION

This invention generally relates to semiconductor processing methods including formation of aluminum:copper alloy interconnects and more particularly to the formation of an improved barrier layer stack to prevent metallic interdiffusion between the interconnect and barrier layers to improve electrical performance.

BACKGROUND OF THE INVENTION

Metallization interconnects are critical to the proper electronic function of semiconductor devices. Several advances in semiconductor processing have been aimed at improving signal transport speed by reducing metal interconnect resistivities and improving electromigration resistance. Copper has increasingly found application for use as metal interconnects in upper levels of a multi-level device due to its low resistivity and higher resistance to electromigration. However, AlCu metal interconnects used in lower levels of the semiconductor device, for example to provide electrical contact to silicon or polysilicon device areas is still preferred for a variety of reasons. Among the reason for continued use of AlCu metal interconnects in lower metallization levels is the compatibility of aluminum with silicon including forming superior contacts and lower susceptibility to corrosion. Further, AlCu is readily etched by reactive ion etching (RIE) to form metal interconnects, for example, in the formation of bit lines for a DRAM portion of embedded memory in a logic circuit. In addition, the use of copper in lower metallization levels creates the potential of diffusion of copper through dielectric insulating layers and poisoning of doped silicon well areas in transistors by creating deep impurity levels and contributing to junction leakage.

One problem with aluminum is that is subject to electromigration under moderate current loads over time. Another drawback is the formation of Al hillocks when subjected to higher temperatures, for example greater than about 300° C. In order to overcome some of these problems, aluminum has been alloyed with copper where the copper is added at less than about 8.0 weight percent. One drawback to alloying metals with aluminum is that the electrical resistivity tends to increase, thus there is a tradeoff between improved electromigration resistance and higher electrical resistance.

Various barrier layers have been used in the prior art to provide resistance to metal migration in AlCu metal interconnect technology. For example, titanium metal has been used in contact with the AlCu metal interconnect to improve a contact resistance. In addition, Liu et al. (U.S. Pat. No. 6,099,701), which is incorporated herein by reference, has proposed a titanium-rich TiN layer to contact with the AlCu metal interconnect to improve an electromigration resistance.

A problem with prior art barrier layers used in AlCu metal interconnect technology is the degradation of electrical resistance, especially when the metal interconnects are subjected to high temperature processes.

Therefore, there is a need in the semiconductor integrated circuit manufacturing art to develop an improved AlCu metal interconnect including an effective barrier layer at elevated temperatures to maintain an AlCu electrical resistance while providing for adequate electromigration resistance.

It is therefore an object of the invention to provide an improved AlCu metal interconnect including an effective barrier layer at elevated temperatures to maintain an AlCu electrical resistance while providing for adequate electromigration resistance, while overcoming other shortcomings of the prior art.

SUMMARY OF THE INVENTION

To achieve the foregoing and other objects, and in accordance with the purposes of the present invention, as embodied and broadly described herein, the present invention provides an improved barrier layer stack and method for forming the same for preserving an aluminum alloy interconnect resistivity.

In a first embodiment, the method includes providing a semiconductor process wafer comprising an exposed conductive region; forming a first barrier layer comprising a barrier layer stack over the exposed conductive region comprising one of a TiN or Ti layer in contact with the conductive region; forming at least one additional barrier layer comprising the barrier layer stack to form an alternating sequence of TiN and Ti layers; forming an uppermost barrier layer of TiN comprising the barrier layer stack; forming an overlying aluminum alloy region in contact with the uppermost barrier layer; and, subjecting the semiconductor process wafer to at least one process comprising a temperature of greater than temperatures greater than about 350° C.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to formation of an AlCu damascene, it will be appreciated that the method of the present invention including the formation of barrier layer stacks may be used as barrier layer stacks in the formation of any AlCu metal interconnect structure where titanium/AlCu thermally enhanced inter-diffusion is advantageously reduced or avoided to avoid degradation of an electrical resistance of the AlCu.

Figure 1A:
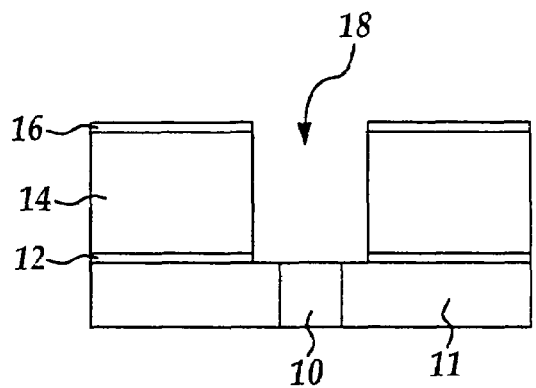
FIGS. 1A–1E are cross sectional representations of a portion of a multi-level semiconductor device at stages in integrated circuit manufacture according to an embodiment of the present invention.

Referring to FIGS. 1A–1E, in an exemplary embodiment of the method of the present invention, cross sectional views of a portion of a semiconductor process wafer are shown at stages in a manufacturing process. Referring to FIG. 1A, a first conductive region 10, for example a tungsten plug, a silicon or polysilicon contact area, or an AlCu metal contact, is provided in a pre-metal dielectric (PMD) insulating layer 11 by known conventional processes of deposition and planarization. Overlying the conductive region 10, a first barrier layer 12 of titanium nitride (TiN) is provided over the tungsten plug by a conventional CVD or PVD process. For example, the titanium nitride layer is deposited by conventional CVD or PVD methods, for example, low pressure CVD (LPCVD), or PVD sputter deposition to a thickness of about 200 to about 800 Angstroms. A titanium (Ti) layer (not shown) may optionally be deposited prior to the TiN layer, for example, by conventional PVD or CVD methods. Overlying the first barrier layer 12 is formed an inter-metal dielectric (IMD) layer 14, formed of, for example a silicon dioxide based material, optionally including a dopant such as fluorine or carbon to lower the dielectric constant. The IMD layer is typically formed by plasma enhanced CVD (e.g., PECVD or HDP-CVD) deposited to a thickness of about 3000 to about 10,000 Angstroms. An anti-reflective coating (ARC) layer 16, such as silicon oxynitride (SION) is optionally deposited over the IMD layer 14 to reduce light reflections in a subsequent photolithographic patterning process to form metal interconnect openings.

Still referring to FIG. 1a, following a conventional photolithographic patterning process a conventional RIE etching process is carried out, for example including fluorocarbon and hydrofluorocarbon etching chemistries, to form a metal interconnect opening 18. For example, a multi-step RIE etching process is carrier out including etching through the ARC layer, the IMD layer, and first barrier layer 12 to form closed communication with the underlying metal layer 10.

Figure 1B:
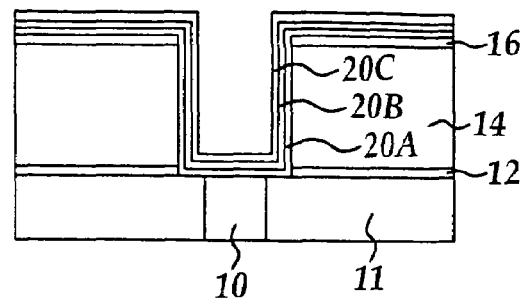

Referring to FIG. 1B, according to an embodiment of the present invention, a first barrier layer stack including 2 or more layers of titanium nitride (e.g., TiN) and titanium (Ti) are blanket deposited such that layers of the barrier layer stack making contact with an underlying or overlying conductive area, for example an aluminum alloy, preferably an AlCu alloy, is formed of TiN. Preferably, the TiN barrier layer e.g., 20A, making contact with the underlying conductive area e.g., 10 is about stoichiometric, where the ratio of titanium (Ti) to nitrogen (N) is from about 0.8 to 1 to about 1.2 to 1, more preferably from about 0.8 to 1 to about 1.0 to 1. Formed immediately adjacent to (overlying) the contacting TiN layer 20A is formed a Ti layer, e.g. 20B. For example, where the underlying conductive area 10 is formed of an aluminum alloy, for example an AlCu alloy, and an overlying filling layer of AlCu will be formed overlying the barrier layer stack, the barrier layer stack preferably includes TiN contacting layers and sandwiched Ti and/or TiN layers, for example, a TiN/Ti/TiN stack sequence, e.g., 20A, 20B, and 20C. It will be appreciated that more than 3 layers in a stack may be provided, for example, a TiN/Ti/TiN/Ti/TiN stack sequence may be provided. It will also be appreciated that if the underlying metal contacting region is not an aluminum alloy, e.g., an AlCu alloy, which does not present a Ti inter-metal diffusion electrical degradation problem, for example tungsten, or polysilicon, a Ti layer may optionally be formed as the contacting layer, e.g., 20A, for example, either a Ti/TiN, e.g., 20A, 20B or a TiN/Ti/TiN barrier layer stack sequence e.g., 20A, 20B, 20C may be provided where the overlying AlCu alloy to fill the metal interconnect opening 18 is formed in contact with an uppermost TiN layer e.g., 20C. In some cases, for example where the contacting metal is polysilicon or tungsten, it may be desirable to have the Ti layer e.g., 20A as a contacting layer to reduce a contact resistance, where the offsetting problem of Ti inter-diffusion will not present a problem when subjected to subsequent elevated processing temperatures, for example greater than about 300° C.

For example it has been found that the electrical bulk resistivity (e.g., sheet resistance) of an aluminum alloy, for example, an AlCu alloy having from about 0.5 wt % to about 4 wt % of copper is undesirably increased by thermally enhanced inter-diffusion of Ti and the AlCu alloy. For example, thermally enhanced inter-diffusion of Ti across a Ti/AlCu interface has been found to degrade the sheet resistance of the AlCu metal interconnect when a contacting Ti barrier layer is subjected to subsequent elevated processing temperatures, for example greater than about 250° C. for extended periods, for example greater than about 30 minutes, and greater than about 300° C., for shorter periods, for example from about 10 minutes to about 30 minutes. As a result, wafer reliability is compromised in subsequent manufacturing steps where the multi-layer process wafer is subjected to subsequent elevated processing temperatures.

For example, several subsequent integrated circuit manufacturing processes may require temperatures of greater than about 250° C., including the deposition of silicon nitride or silicon oxynitride etching stop and anti-reflective coating (ARC) layers where temperatures may approach 350° C. or higher. In addition, subsequent deposition or annealing of the AlCu alloy may itself result in elevated temperatures causing immediate Ti/AlCu inter-diffusion and resistivity degradation.

For example, AlCu may be deposited by a variety of methods including CVD and PVD. For example, in a two step deposition process a first layer of aluminum is deposited by CVD followed by PVD deposition of an overlying layer of AlCu. Temperatures during the CVD or PVD sputter process typically rise above at least about 250° C. in a PVD or CVD process. In a force-fill method, AlCu is first sputtered to fill the contact opening followed by exposure to a high pressure atmosphere (e.g., 550 to 650 MPa) and a temperature of about 350° C. to 400° C. to soften the AlCu metal and collapse any voids that may be present in the metal interconnect. In addition, following AlCu deposition, an annealing process may optionally be performed at temperatures from about 350° C. to 400° C. to improve the copper distribution within the aluminum to achieve better electromigration resistance.

According to preferred embodiments of the present invention, the barrier layer stacks may be formed by a PVD sputtering process or a CVD process, or a combination of these methods. For example, in a preferred reactive sputtering process, a glow discharge is created in an atmosphere (e.g., 1 to 5 Torr) containing a gas mixture of preferably nitrogen and argon ($N_2$/Ar) which is formed by introducing $N_2$ and Ar together or separately into the sputtering chamber to form a gas mixture to contact the process surface for a time period prior to initiating the glow discharge to sputter a Ti sputtering target to deposit TiN. Preferably, ultra-high purity gases are used for the sputtering process, for example greater than about 99.99 percent purity. Preferably a magnetron sputtering source is used, more preferably an ionized magnetron sputtering source, to allow biasing of the process wafer and accelerating ions to the deposition surface to provide better step coverage in high aspect ratio openings, for example greater than about 5:1 (depth:diameter or width). In a preferred embodiment, of the present invention, a pre-flow sputter gas mixture, preferably $N_2$ and Ar to form an $N_2$/Ar gas mixture is introduced into the magnetron sputtering chamber to contact the process wafer for a period of from about 1 to about 3 seconds prior to initiating the glow discharge for Ti sputtering where sputtered Ti reacts with nitrogen on the process surface to form TiN.

Preferably, the ratio of nitrogen gas to argon introduced into the sputtering chamber in the pre-flow period is from about 1.3 to about 3.5, more preferably about 1.3 to about 2.5 and is maintained within the same range during the Ti sputtering process to form a TiN layer. For example, for a 200 mm process wafer, the flow rate of nitrogen is from about 60 to about 80 sccm and the argon flow rate is from about 45 to about 55 sccm. For 300 mm process wafer, which produce a larger surface area and altered flow and glow discharge characteristics in the sputter chamber, the nitrogen flow rate is from about 70 to about 90 sccm and the argon flow rate is from about 25 to about 35 sccm. The $N_2$/Ar pre-flow contacting step is an important aspect of the invention since the concentration of nitrogen on the wafer process surface dictates the nature of the TiN film produced, where the sputtered Ti atoms react with nitrogen atoms at the surface to form the TiN film. Preferably, the pre-flow period is from about 1 second to about 5 seconds, more preferably about 1 to about 3 seconds prior to initiating the Ti sputter process. For example, a TiN barrier layer, e.g., 20A is formed first as a contacting barrier layer deposited in contact with an underlying conductive area, for example an AlCu metal alloy, the TiN barrier layer preferably deposited to a thickness of about 50 Angstroms to about 200 Angstroms. An overlying layer of Ti e.g., 20B is then deposited after turning off the nitrogen gas flow so form a sputtering atmosphere essentially containing argon during the Ti sputtering process. The Ti barrier layer, e.g., 20B is preferably deposited at a thickness from about 50 Angstroms to about 200 Angstroms. In one embodiment, a second layer of TiN, e.g., 20C, for contacting an overlying conductive region, for example an aluminum alloy, is then deposited overlying the Ti layer by turning off the glow discharge prior to conducting the $N_2$/Ar pre-flow contact step under preferred conditions followed by initiating the glow discharge and sputtering Ti under the same conditions as the first TiN barrier layer to form the second TiN barrier layer. The second TiN barrier layer is preferably deposited at about the same thickness as the first TiN barrier layer. Preferably, the total thickness of the barrier layer stack is from about 150 Angstroms to about 600 Angstroms, more preferably from about 150 Angstroms to about 400 Angstroms.

Alternatively the barrier layer stack may be produced by CVD processes, for example a TiN layer is deposited using TDEAT or TDMAT, preferably TDEAT, followed by an annealing process at about 350° C. to about 400° C., followed by a PVD process to sputter an overlying layer of Ti which is followed by forming a second overlying CVD TiN layer.

Figure 1C:
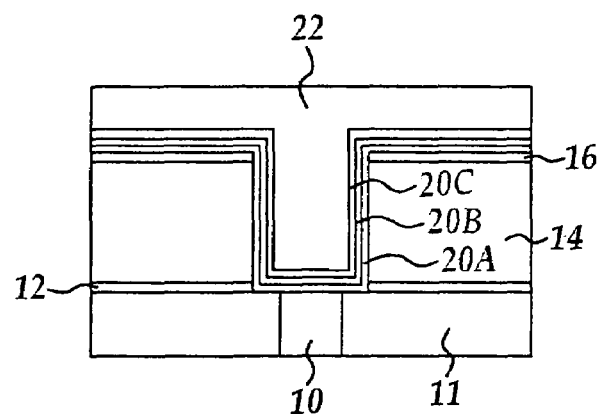

Referring to FIG. 1C, following deposition of the barrier layer stack e.g., 20A, 20B, 20C, according to preferred embodiments, an aluminum alloy layer 22, preferably AlCu, is deposited to fill the metal interconnect opening 18. The AlCu deposition process may be formed by at least one of a PVD and CVD process. For example, in a two step process, a first thin layer, e.g., 50 to 100 Angstroms of Al is deposited a by a CVD process to provide a wetting layer, followed by a PVD process, for example, ionized magnetron sputtering, also referred to as ionized metal plasma (IMP) to deposit an AlCu alloy layer, the alloy preferably having from about 0.5 wt % Cu to about 4 wt % Cu, more preferably, about 1.0 wt % to about 2.5 wt % Cu. The AlCu deposition process may also include AlCu PVD deposition followed by a force fill (or reflow anneal) where the process wafer is heated from about 350° C. to 400° C. at elevated pressure of from about 550 to about 650 MPa for a period of from about 10 minutes to about 30 minutes to soften the AlCu alloy to reflow and fill any voids in the interconnect openings as well as uniformly distribute the copper throughout the aluminum. A quick cool or quench process may be optionally employed following the annealing process to minimize the time at high temperature, for example by blowing cool gas onto the process wafer backside or by passing cooled fluid through a heat exchange surface in contact with the process wafer backside.

Figure 1D:
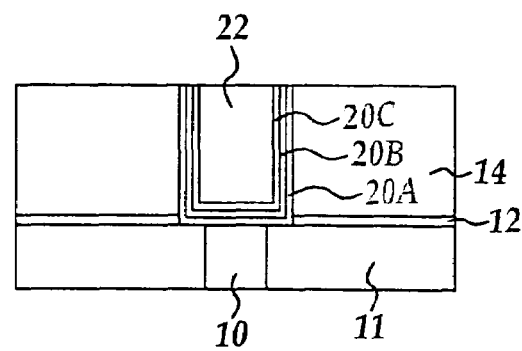
Figure 1E:
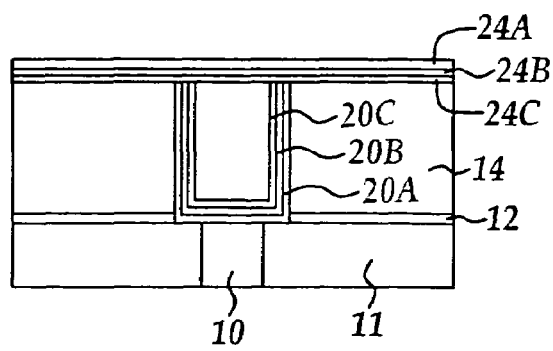

Referring to FIG. 1D, following filling of the interconnect openings e.g., 18 with the AlCu layer 22 and an optional reflow or alloying process, a planarization step, for example one of a dry etchback process, a CMP process, or combination thereof, is carried out to remove excess AlCu above the opening level, optionally including removing the first barrier layer stack above the ARC layer 16 level, and optionally the ARC layer 16. Referring to FIG. 1E, a second barrier layer stack is deposited overlying the planarized AlCu filled interconnects, e.g., a TiN/Ti/TiN stack, 24A, 24B, 24C is deposited according to the preferred embodiments outlined for the first barrier layer stack.

The barrier layer stack formed according to preferred embodiments with a TiN blocking layer e.g., 20A and 20C, in contact with the AlCu, advantageously reduces the thermally enhanced inter-diffusion of Ti into AlCu when the process wafer is subject to subsequent elevated temperatures in forming a multi-layered semiconductor device, thereby avoiding degradation in electrical resistivity AlCu metal interconnects. For example, the wafer reliability life time has been found to be increased by about an order of magnitude when barrier layer stacks according to preferred embodiments are formed to contact AlCu metal interconnects having critical dimensions of 0.15 micron and above in logic circuits and formed with 300 mm diameter process wafers. Other advantages of the method of the present invention is that design rules are not changed, additional mask layers are not required, and additional separate processing steps are not required.

In the case multiple TiN or Ti containing barrier layer stacks are formed for either the first or second barrier layer stacks, for example preferably beginning with a TiN layer in contact with an adjacent underlying or overlying AlCu layer, e.g., a TiN/Ti/TiN/Ti/TiN stack, at least the inner sandwiched layers are preferably formed to a relatively thinner thickness, for example from about ¼ to about ½ the thickness of layers in a 3 layer stack, e.g., TiN/Ti/TiN stack to form about the same overall thickness, e.g., from about 150 Angstroms to about 600 Angstroms. In addition the inner or sandwiched TiN layers may optionally be formed to be more Ti-rich compared to the outer contacting TiN layers, for example having a titanium to nitrogen ratio of up to about 2.0 to 1 to improve contact resistance and wetting of the overlying AlCu layer. Where diffusion of Ti into the underlying conductive area is not considered undesirable, for example, a silicon or polysilicon conductive area, where a silicided titanium layer may be formed, but where an overlying layer of AlCu is formed, the stack sequence may begin with a Ti layer adjacent the underlying conductive area and end with a TiN layer in contact with the overlying AlCu area, e.g., a stack sequence of Ti/TiN or Ti/TiN/Ti/TiN.

With respect to forming a barrier layer stack overlying an AlCu filled metal interconnect formed in a dielectric insulating layer, it is preferred for the barrier layer stack sequence begin with a TiN layer adjacent and contacting the AlCu layer to prevent metallic inter-diffusion and end with an uppermost TiN layer formed to contact an overlying formed dielectric insulating layer to achieve the benefits the adhesion enhancing properties of TiN, even in the case where Ti inter-diffusion into an overlying formed conductive area will not present an electrical degradation problem, e.g., a tungsten metal area.

Figure 2:
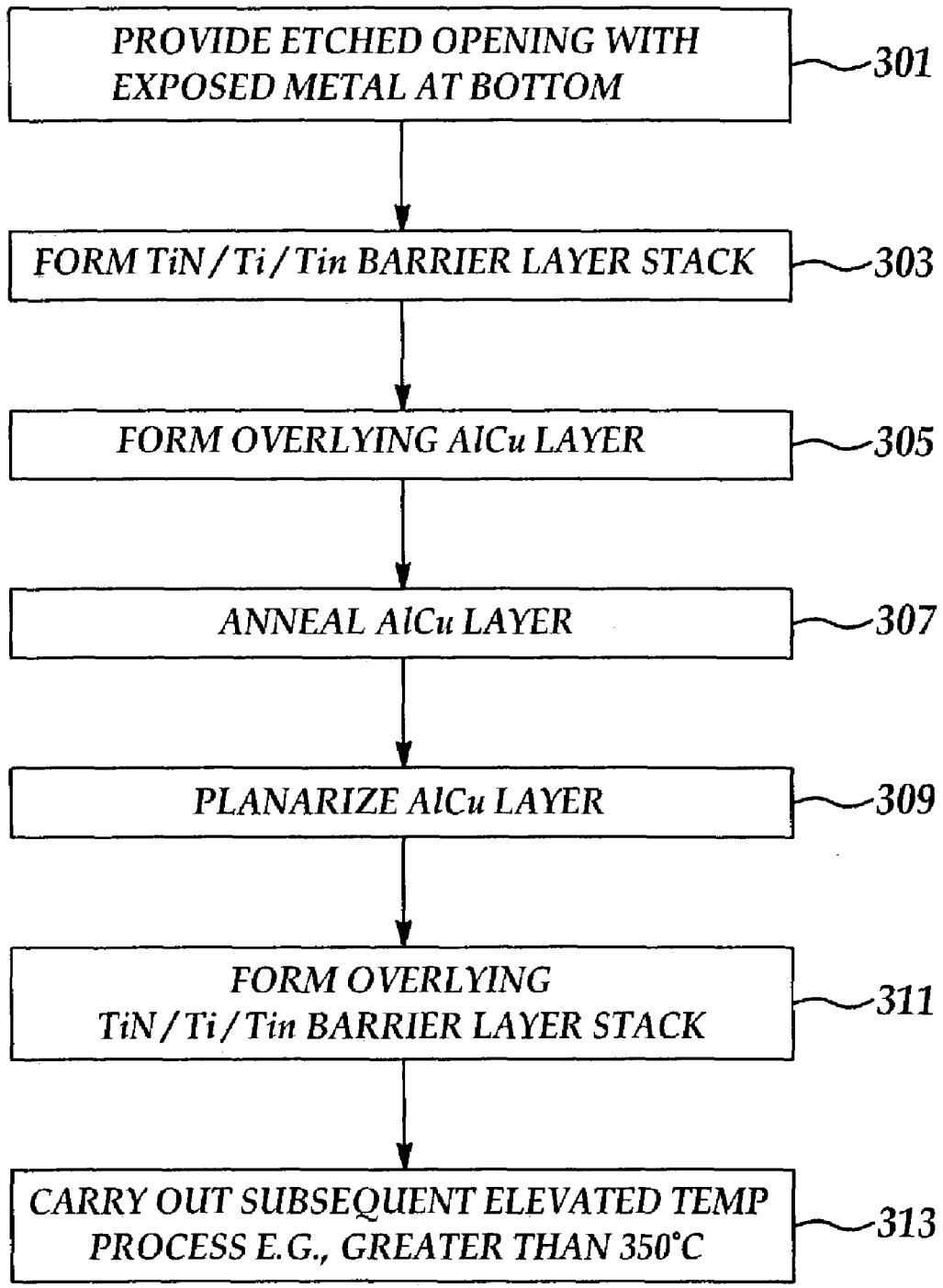
FIG. 2 is a process flow diagram including several embodiments of the present invention.

Referring to FIG. 2 is a process flow diagram including several embodiments of the present invention. In process 301 a dielectric insulating layer (IMD layer) is provided including at an etched metal interconnect openings extending through a thickness portion to form closed communication with an underlying conductive area. In process 303, a barrier layer stack, e.g., a TiN/Ti/TiN stack is formed over the underlying conductive area by at least one of a PVD and CVD process according to preferred embodiments. In process 305, an aluminum alloy layer, e.g., AlCu is formed to fill the openings by at least one of a PVD and CVD process. In process 307 an annealing process is carried out at a temperature greater than about 300° C. In process 309, the AlCu layer is planarized, in process 311, another barrier layer stack, e.g., a TiN/Ti/TiN stack is blanket deposited by one of a PVD and CVD process overlying the AlCu filed metal interconnects. In process 313, subsequent processes raising the AlCu temperature to elevated temperatures e.g., greater than about 350° C. are carried out.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming an improved barrier layer stack for preserving an aluminum alloy interconnect resistivity comprising the steps of:
   providing a semiconductor process wafer comprising an exposed conductive region;
   forming a first barrier layer comprising a barrier layer stack over the exposed conductive region comprising a titanium nitride (TiN) layer in contact with the conductive region;
   forming at least one additional barrier layer comprising the barrier layer stack to form an alternating sequence of TIN and Ti layers;
   forming an uppermost barrier layer of TiN comprising the barrier layer stack;
   forming an overlying aluminum alloy region in contact with the uppermost barrier layer, wherein the exposed conductive region and the overlying aluminum alloy layer comprises an AlCu alloy; and,
   subjecting the semiconductor process wafer to at least one process comprising a temperature of greater than about 300° C.

2. The method of claim 1, wherein the at least one subsequent process comprises an AlCu deposition process, an AlCu reflow process, an AlCu annealing process, and a metal nitride deposition process.

3. The method of claim 2, wherein the at least one subsequent process is maintained at a temperature of less than about 450° C.

4. The method of claim 1, wherein the barrier layer stack sequence comprises at least one TiN/Ti sequence to stop with an uppermost layer of TiN.

5. The method of claim 1, wherein the barrier layer stack sequence comprises at least one Ti/TiN sequence to stop with an uppermost layer of TiN.

6. The method of claim 1, wherein the barrier layer stack is formed by at least one of a CVD and PVD process.

7. The method of claim 1, wherein the barrier layer stack is formed by a reactive sputtering process comprising:
   a) flowing $N_2$ and Ar to form a gas mixture to contact the process wafer for a period of time prior to initiating a glow discharge in a sputter deposition process wherein the gas mixture comprises a ratio of nitrogen to argon of about 1.3 to 1 to about 2.5 to 1;
   b) initiating a glow discharge to sputter Ti;
   c) forming a layer of TiN;
   d) turning off the $N_2$ flow to form a sputter atmosphere consisting essentially of argon;
   e) depositing a layer of Ti;
   wherein at least steps a through c are repeated at least once with step c comprising the final step.

8. The method of claim 1, wherein the barrier layer stack is formed by a reactive sputtering process comprising:
   a) forming a sputter atmosphere consisting essentially of argon;
   b) initiating a glow discharge to sputter Ti;
   c) depositing a layer of Ti;
   d) stopping the glow discharge;
   e) flowing $N_2$ and Ar to form a gas mixture to contact the process wafer for a period of time prior to initiating a glow discharge in a sputter deposition process wherein the gas mixture comprises a ratio of nitrogen to argon of about 0.1 to 10;
   f) initiating a glow discharge to sputter Ti;
   g) forming a layer of TiN;
   wherein steps a through g are optionally repeated at least once.

9. A method for forming a metallic inter-diffusion resistant barrier layer stack for preserving an AlCu interconnect resistivity comprising the steps of:
   providing a semiconductor process wafer comprising a metal interconnect opening formed to extend through a thickness of at least one dielectric insulating layer to form closed communication with an underlying conductive region, said underlying conductive region comprises an AlCu alloy;
   forming a titanium nitride (TiN) barrier layer over the conductive region to contact with the conductive region and line the metal interconnect opening;
   forming at least one sequence of a titanium (Ti) barrier layer followed by a TiN barrier layer to end with an uppermost TIN barrier layer to form a barrier layer stack;
   forming an AlCu layer over the barrier layer stack to fill the metal interconnect opening;
   annealing the AlCu layer at a temperature of about 300° C. to about 450° C.

10. The method of claim 9 wherein the AlCu layer comprises a copper concentration of about 0.5 weight percent to about 4.0 weight percent.

11. The method of claim 9, wherein the barrier layer stack is formed by at least one of a CVD and PVD process.

12. The method of claim 9, wherein the barrier layer stack is formed by a reactive sputtering process comprising:
   a) flowing $N_2$ and Ar to form a gas mixture to contact the process wafer for a period of time prior to initiating a glow discharge in a sputter deposition process wherein the gas mixture comprises a ratio of nitrogen to argon of about 0.1 to 10;
   b) initiating a glow discharge to sputter Ti;
   c) forming a layer of TiN;
   d) turning off the $N_2$ flow to form a sputter atmosphere consisting essentially of argon;
   e) depositing a layer of Ti;
   wherein at least steps a through c are repeated at least once with step c comprising the final step.

13. The method of claim 12, wherein the reactive sputtering process comprises one of a magnetron sputtering process and an ion metal plasma (IMP) process.

14. The method of claim 9, wherein the TiN layer is formed having a ratio of Ti to N of about 0.1 to 10.

15. The method of claim 9, further comprising the steps of:
  planarizing the AlCu layer; and,
  forming a second barrier layer stack over the AlCu layer comprising at least one stack sequence of TiN/Ti/TiN.

16. The method of claim 9, wherein the TiN barrier layers and the Ti barrier layers are formed at a thickness between about 50 Angstroms and about 200 Angstroms.

17. The method of claim 9, wherein the barrier layer stack thickness is between about 10 Angstroms to about 600 Angstroms.

* * * * *